(12) United States Patent
Wan et al.

(10) Patent No.: US 10,090,349 B2
(45) Date of Patent: Oct. 2, 2018

(54) CMOS IMAGE SENSOR CHIPS WITH STACKED SCHEME AND METHODS FOR FORMING THE SAME

(75) Inventors: Meng-Hsun Wan, Taipei (TW); Szu-Ying Chen, Toufen Township (TW); Dun-Nian Yaung, Taipei (TW); Jen-Cheng Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 774 days.

(21) Appl. No.: 13/571,099

(22) Filed: Aug. 9, 2012

(65) Prior Publication Data

US 2014/0042298 A1    Feb. 13, 2014

(51) Int. Cl.
*H01L 27/146* (2006.01)

(52) U.S. Cl.
CPC .... *H01L 27/14634* (2013.01); *H01L 27/1464* (2013.01); *H01L 27/1469* (2013.01)

(58) Field of Classification Search
CPC ..... H01L 21/00; H01L 23/00; H01L 2925/00; H01L 2933/00; H01L 31/18; H01L 31/113; H01L 27/146; H01L 27/148; H04N 5/335
USPC ....... 250/208.1, 214.1, 214 R; 257/226, 228, 257/257, 258, 291, 294, 432; 438/60, 70; 348/294–312
See application file for complete search history.

(56) References Cited

U.S. PATENT DOCUMENTS

| | | | |
|---|---|---|---|
| 4,672,453 A * | 6/1987 | Sakamoto | H04N 1/40056 348/311 |
| 7,119,322 B2 | 10/2006 | Hong | |
| 7,336,808 B2 | 2/2008 | Mizuno et al. | |
| 7,470,893 B2 | 12/2008 | Suzuki et al. | |
| 7,495,206 B2 | 2/2009 | Park | |
| 7,745,860 B2 * | 6/2010 | Inoue et al. | 257/292 |
| 7,965,329 B2 * | 6/2011 | McCarten et al. | 348/308 |
| 8,049,256 B2 | 11/2011 | Guidash | |
| 8,325,221 B2 | 12/2012 | Lee | |
| 8,558,292 B2 | 10/2013 | Guidash | |
| 8,629,524 B2 | 1/2014 | Wang et al. | |
| 2003/0214595 A1 | 11/2003 | Mabuchi | |
| 2004/0263668 A1 | 12/2004 | Kim et al. | |
| 2005/0110159 A1 | 5/2005 | Oh et al. | |
| 2005/0133021 A1 | 6/2005 | Kobayashi | |
| 2005/0275418 A1 | 12/2005 | Chong et al. | |

(Continued)

FOREIGN PATENT DOCUMENTS

| | | |
|---|---|---|
| EP | 1617480 A2 | 1/2006 |
| JP | 2003232679 | 8/2003 |

(Continued)

*Primary Examiner* — Georgia Y Epps
*Assistant Examiner* — Don Williams
(74) *Attorney, Agent, or Firm* — Slater Matsil, LLP

(57) ABSTRACT

A device includes an image sensor chip having an image sensor therein. A read-out chip is underlying and bonded to the image sensor chip, wherein the read-out chip includes a logic device selected from the group consisting essentially of a reset transistor, a source follower, a row selector, and combinations thereof therein. The logic device and the image sensor are electrically coupled to each other, and are parts of a same pixel unit. A peripheral circuit chip is underlying and bonded to the read-out chip, wherein the peripheral circuit chip includes a logic circuit.

20 Claims, 9 Drawing Sheets

(56) References Cited

U.S. PATENT DOCUMENTS

| | | |
|---|---|---|
| 2006/0278992 A1 | 12/2006 | Trezza et al. |
| 2007/0045836 A1 | 3/2007 | Kwon et al. |
| 2007/0181780 A1 | 8/2007 | Suzuki et al. |
| 2008/0083939 A1* | 4/2008 | Guidash ............ H01L 27/14634 257/292 |
| 2008/0203452 A1 | 8/2008 | Moon et al. |
| 2008/0272464 A1 | 11/2008 | Do et al. |
| 2009/0200624 A1 | 8/2009 | Dai et al. |
| 2010/0013907 A1 | 1/2010 | Lee |
| 2010/0238334 A1 | 9/2010 | Takahashi |
| 2010/0248412 A1* | 9/2010 | Guidash .......................... 438/65 |
| 2010/0258890 A1 | 10/2010 | Ahn |
| 2010/0276572 A1 | 11/2010 | Iwabuchi et al. |
| 2011/0121420 A1 | 5/2011 | Yang |
| 2011/0159634 A1 | 6/2011 | Oshiki et al. |
| 2011/0163223 A1 | 7/2011 | Guidash |
| 2011/0260221 A1 | 10/2011 | Mao et al. |
| 2012/0199930 A1* | 8/2012 | Hayashi .............. H01L 27/1461 257/435 |
| 2013/0026592 A1* | 1/2013 | Lapadatu .......... H01L 27/14634 257/432 |
| 2013/0068929 A1 | 3/2013 | Solhusvik et al. |
| 2013/0107075 A1* | 5/2013 | Kobayashi et al. ....... 348/222.1 |
| 2013/0264467 A1 | 10/2013 | Hong et al. |
| 2013/0292548 A1 | 11/2013 | Agranov et al. |
| 2013/0320194 A1 | 12/2013 | Chen et al. |
| 2014/0042299 A1 | 2/2014 | Wan et al. |

FOREIGN PATENT DOCUMENTS

| | | |
|---|---|---|
| JP | 2003338615 | 11/2003 |
| JP | 2006191081 | 7/2006 |
| JP | 2007228460 A | 9/2007 |
| JP | 2008066410 A | 3/2008 |
| KR | 1020040110296 | 12/2004 |
| KR | 1020060011429 | 2/2006 |
| KR | 1020060011845 | 2/2006 |
| KR | 20070093450 | 8/2007 |
| KR | 100825808 | 4/2008 |
| KR | 1020090065980 | 6/2009 |
| KR | 1020090077904 | 7/2009 |
| KR | 20100112852 | 10/2010 |
| WO | 2004105137 | 12/2004 |
| WO | 2006086512 | 8/2006 |
| WO | 2008045356 | 4/2008 |
| WO | 2012001911 A1 | 1/2012 |
| WO | 2012004965 | 1/2012 |

* cited by examiner

CMOS IMAGE SENSOR CHIPS WITH STACKED SCHEME AND METHODS FOR FORMING THE SAME

CROSS-REFERENCES TO RELATED APPLICATIONS

This application relates to the following commonly-assigned U.S. patent applications: application Ser. No. 13/571,184, filed Aug. 9, 2012, entitled "CMOS Image Sensor Chips with Stacked Scheme and Methods for Forming the Same"; application Ser. No. 13/486,724, filed Jun. 1, 2012, entitled "Image Sensors with High Fill-Factor;" and application Ser. No. 13/458,812, filed Apr. 27, 2012, entitled "Apparatus for Vertical Integrated Backside Illuminated Image sensors," which applications are hereby incorporated herein by reference.

BACKGROUND

Backside Illumination (BSI) image sensor chips are replacing front-side illumination sensor chips for their higher efficiency in capturing photons. In the formation of BSI image sensor chips, image sensors (such as photo diodes) and logic circuits are formed on a silicon substrate of a wafer, followed by the formation of an interconnect structure on a front side of a silicon chip. The wafer is then thinned, and backside structures such as color filters and micro-lenses are formed on the backside of the silicon substrate.

The image sensors in the BSI image sensor chips generate electrical signals in response to the stimulation of photons. The magnitudes of the electrical signals (such as the currents) depend on the intensity of the incident light received by the respective image sensors. To increase the quantum efficiency of image sensors, the image sensors are preferably to occupy a high percent of the chip area that is used by the pixel units, which pixel units include the image sensors. Due to the fact that the pixel units also include additional devices besides the image sensors, including, for example, transfer gate transistors, reset transistors, source followers, and row selectors, the improvement in the quantum efficiency is limited.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A stacked image sensor chip/wafer and the method of forming the same are provided in accordance with various exemplary embodiments. The intermediate stages of forming the stacked image sensor chip and the respective stacked wafers are illustrated. The variations of the embodiments are discussed. Throughout the various views and illustrative embodiments, like reference numbers are used to designate like elements.

Figure 1:
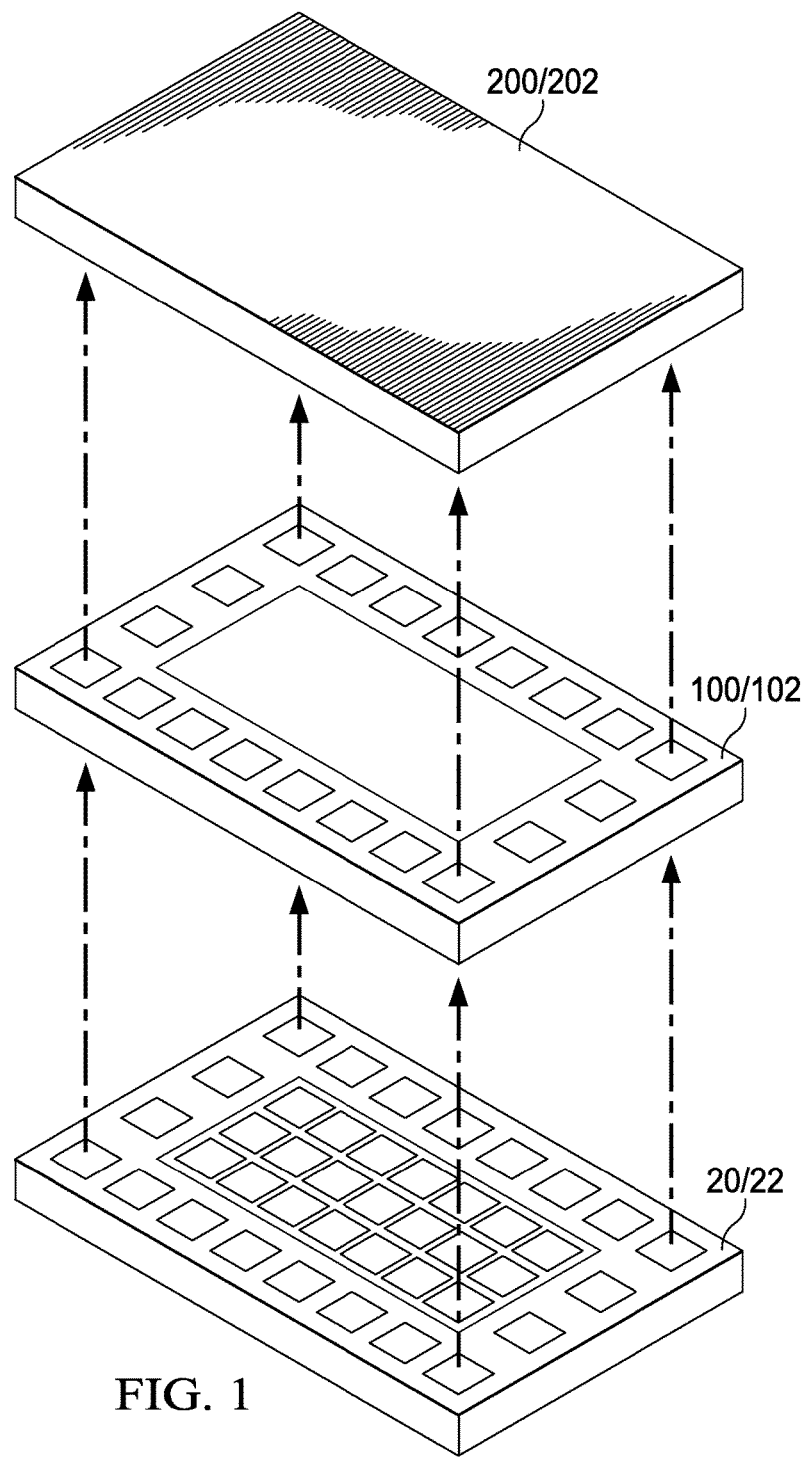
FIG. 1 illustrates a stacking scheme of a stacked image sensor die (or wafer) in accordance with some exemplary embodiments.

FIG. 1 schematically illustrates the stacking scheme of a stacked image sensor die (or wafer) in accordance with some exemplary embodiments. Backside Illumination (BSI) image sensor chip 20 is bonded to read-out chip 100, for example, through metal-to-metal bonding or a hybrid bonding including both the metal-to-metal bonding and the oxide-to-oxide bonding. Read-out chip 100 is further bonded to peripheral circuit chip 200, which may be an Application Specific Integrated Circuit (ASIC) chip. Peripheral circuit chip 200 may include Image Signal Processing (ISP) circuits, and may, or may not, further include other circuits that are related to the BSI applications. The bonding of chips 20, 100, and 200 may be at wafer level. In the wafer-level bonding, wafers 22, 102, and 202, which include chips 20, 100, and 200, respectively, are bonded together, and are then sawed into dies. Alternatively, the bonding may be performed at the chip level.

Figure 2:
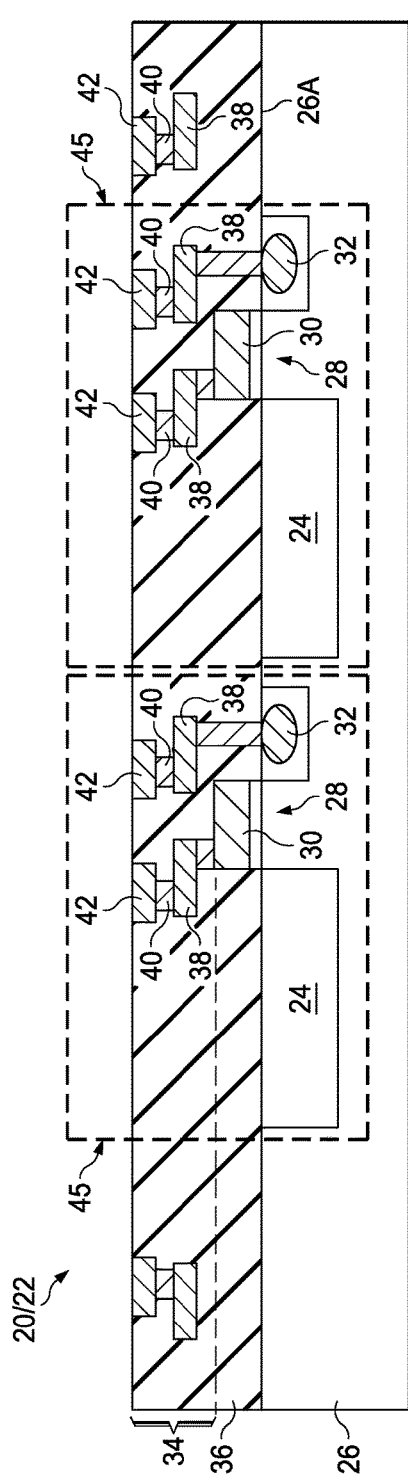
FIGS. 2 through 9 are cross-sectional views of intermediate stages in the manufacturing of a stacked image sensor wafer/chip in accordance with some exemplary embodiments.

FIGS. 2 through 9 illustrate the cross-sectional views of intermediate stages in the stacking of a BSI image sensor chip/wafer and a peripheral circuit chip/wafer in accordance with some exemplary embodiments. FIG. 2 illustrates image sensor chip 20, which may be a part of wafer 22 that includes a plurality of image sensor chips 20 therein. Image sensor chip 20 includes semiconductor substrate 26, which may be a crystalline silicon substrate or a semiconductor substrate formed of other semiconductor materials. Throughout the description, surface 26A is referred to as a front surface of semiconductor substrate 26, and surface 26B is referred to as a back surface of semiconductor substrate 26. Image sensors 24 are formed at front surface 26A of semiconductor substrate 26. Image sensors 24 are configured to convert light signals (photons) to electrical signals, and may be photo-sensitive Metal-Oxide-Semiconductor (MOS) transistors or photo-sensitive diodes. Accordingly, throughout the description, image sensors 24 are alternatively referred to as photo diodes 24, although they may be other types of image sensors. In some exemplary embodiments, photo diodes 24 extend from front surface 26A into semiconductor substrate 26, and form an image sensor array, which is illustrated in a top view shown in FIG. 11.

In some embodiments, each of photo diodes 24 is electrically coupled to a first source/drain region of transfer gate transistor 28, which includes gate 30. The first source/drain region of transfer gate transistor 28 may be shared by the connecting photo diode 24. Floating diffusion capacitor 32 is formed in substrate 26, for example, through implanting into substrate to form a p-n junction, which acts as floating diffusion capacitor 32. Floating diffusion capacitor 32 may be formed in a second source/drain region of transfer gate transistor 28, and hence one of the capacitor plates of floating diffusion capacitor 32 is electrically coupled to the second source/drain region of transfer gate transistor 28. Photo diodes 24, transfer gate transistors 28, and floating diffusion capacitors 32 form portions 45 of pixel units 300 (not shown in FIG. 2, please refer to FIGS. 4 and 10).

In some embodiments, image sensor chip 20 and wafer 22 are free from, or substantially free from, additional logic devices (for example, logic transistors) other than transfer gate transistors 28. Furthermore, image sensor chip 20 and wafer 22 may be free from the peripheral circuits of image sensor chips, which peripheral circuits include, for example, the Image Signal Processing (ISP) circuits, which may include Analog-to-Digital Converters (ADCs), Correlated Double Sampling (CDS) circuits, row decoders, and the like.

Referring again to FIG. 2, front-side interconnect structure 34 is formed over semiconductor substrate 26, and is used to electrically interconnect the devices in image sensor chip 20. Front-side interconnect structure 34 includes dielectric layers 36, and metal lines 38 and vias 40 in dielectric layers 36. Throughout the description, the metal lines 38 in a same dielectric layer 36 are collectively referred to as being a metal layer. Interconnect structure 34 may include a plurality of metal layers. Dielectric layers 36 may include low-k dielectric layers and possibly a passivation layer(s) over the low-k dielectric layers. The low-k dielectric layers have low k values, for example, lower than about 3.0. The passivation layer may be formed of a non-low-k dielectric material having a k value greater than 3.9.

At the front surface of wafer 22 are metal pads 42, which may have a high surface flatness achieved by a planarization step such as Chemical Mechanical Polish (CMP). The top surfaces of metal pads 42 are substantially level with the top surface of dielectric layer 36, and are substantially free from dishing and erosion. Metal pads 42 may comprise copper, aluminum, and possibly other metals. In some embodiments, each of gates 30 of transfer gate transistors 28 is electrically coupled to one of metal pads 42. Accordingly, gates 30 receive transfer signals through metal pads 42. Each of floating diffusion capacitor 32 is electrically coupled to one of metal pads 42, so that the charges stored in diffusion capacitor 32 may be discharged to chip 100 (not shown in FIG. 2, please refer to FIG. 4) through the respective coupling metal pads 42. Accordingly, each of the pixel units 300 (referring to FIG. 4) may include two of metal pads 42. It is appreciated that the number of metal pads 42 in each of pixel units 300 is related to the configuration of pixel units 300. Accordingly, each of pixel units 300 may include a different number of metal pads 42, such as 3, 4, 5, etc.

Figure 3:
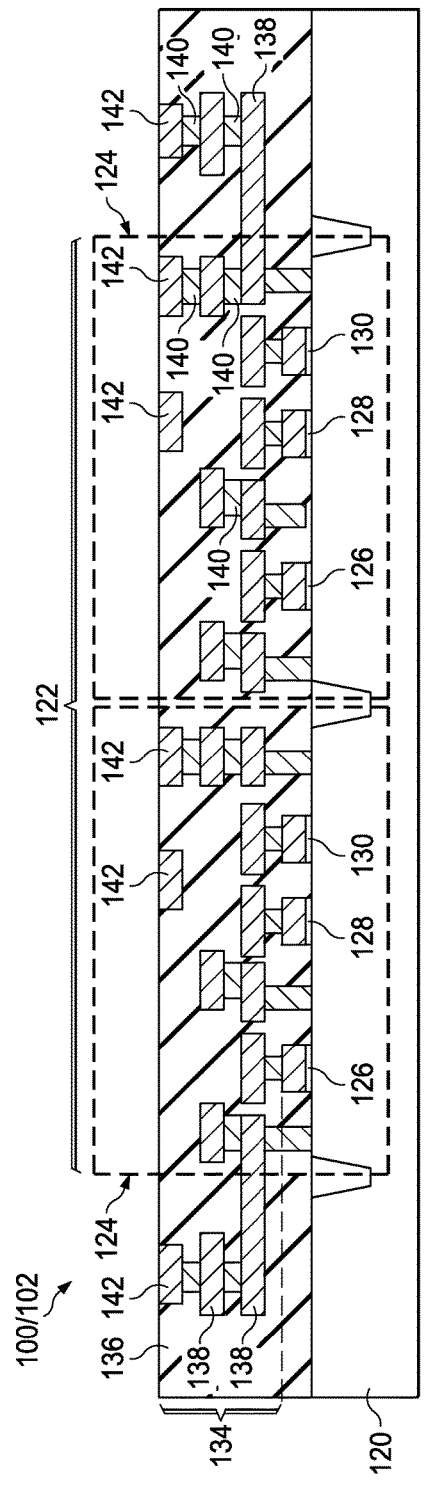

FIG. 3 illustrates a cross-sectional view of device chip 100, which is in wafer 102 that comprises a plurality of identical device chips identical to device chip 100. Device chip 100 includes substrate 120, and logic circuit 122 formed at the front surface of substrate 120. Substrate 120 is a silicon substrate in some embodiments. Alternatively, substrate 120 is formed of other semiconductor materials such as silicon germanium, silicon carbon, III-V compound semiconductor materials, or the like. In accordance with some embodiments, logic circuit 122 includes a plurality of transistors, including row selectors 126, source followers 128, and reset transistors 130. Row selectors 126, source followers 128, and reset transistors 130 may form a plurality of pixel unit portions 124, with each of pixel unit portions 124 including one of row selectors 126, one of source followers 128, and one of reset transistors 130.

Figure 4:
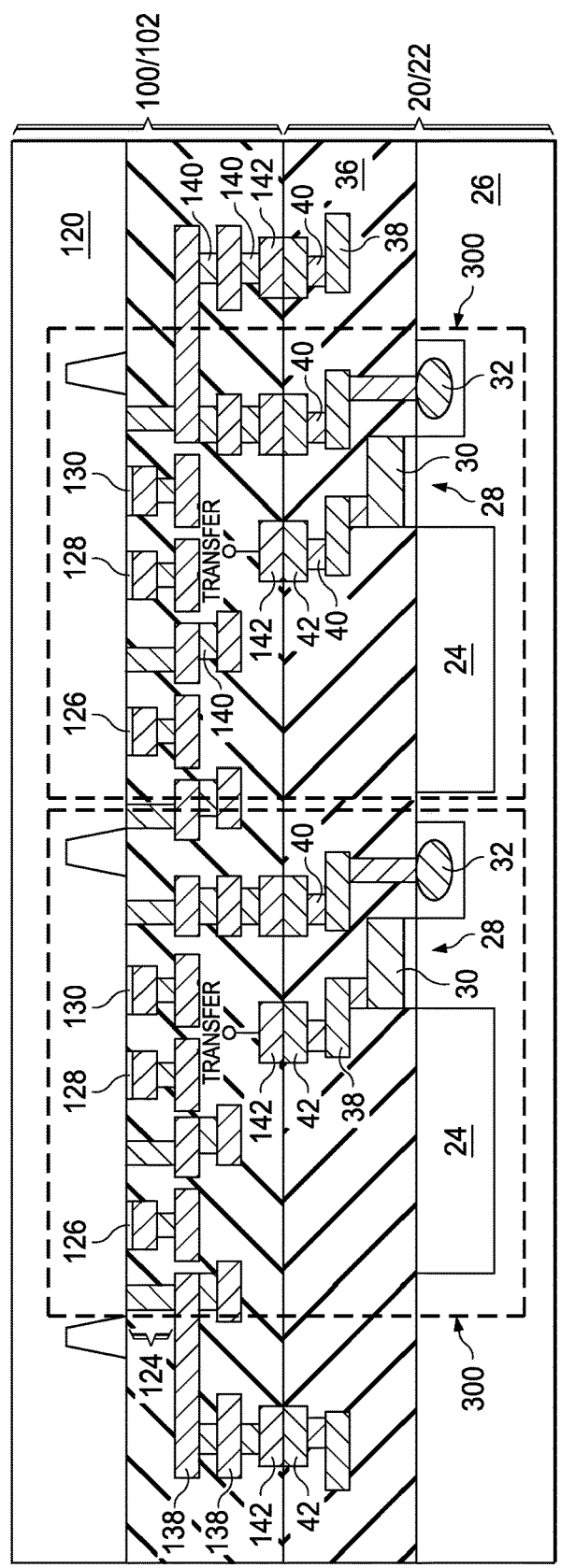

In some embodiments, chip 100 is free from, or substantially free from, logic devices (such as logic transistors) that are not included in pixel units 300 (please refer to FIG. 4). For example, chip 100 may be substantially free from ISP circuits, which may include ADCs, CDS circuits, row decoders, and the like. In alternative embodiments, some of the logic circuits may be formed in chip 100. For example, the row decoders may be formed in chip 100, while the ADCs and the CDS circuits are not formed in chip 100.

Interconnect structure 134 is formed over, and electrically coupling pixel unit portions 124 to peripheral circuit 204 in chip 200 (not shown in FIG. 3, please refer to FIG. 4). Interconnect structure 134 includes a plurality of metal layers in a plurality of dielectric layers 136. Metal lines 138 and vias 140 are disposed in dielectric layers 136. In some exemplary embodiments, dielectric layers 136 include low-k dielectric layers. The low-k dielectric layers may have low k values that are lower than about 3.0. Dielectric layers 136 may further include a passivation layer formed of non-low-k dielectric materials having k values greater than 3.9. In some embodiments, the passivation layer includes a silicon oxide layer, an un-doped silicate glass layer, and/or the like.

Metal pads 142 are formed at the surface of wafer 102, wherein metal pads 142 may have high surface flatness achieved by CMP with substantially low dishing or erosion effect with relative to the top surface of the top dielectric layer 136. Metal pads 142 may also comprise copper, aluminum, and/or other metals. In some embodiments, each of the pixel unit portions 124 is electrically connected to one or more of metal pads 142.

Figure 11:
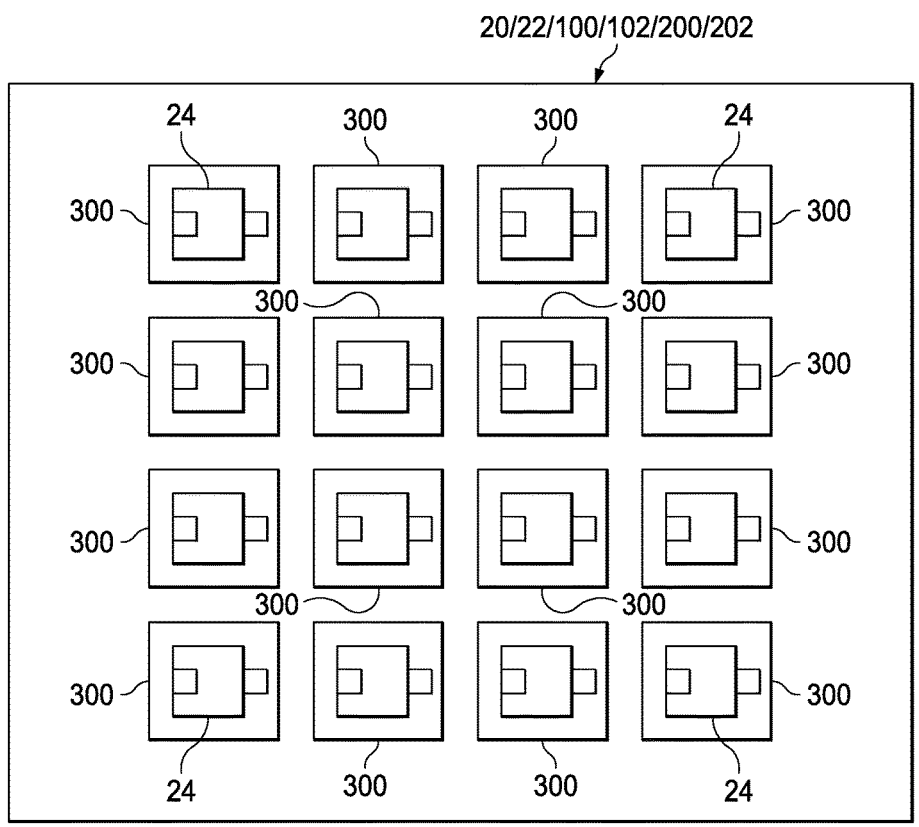
FIG. 11 illustrates a top view of exemplary pixel units, which are separated into two stacked chips.

Referring to FIG. 4, wafers 22 and 102 are bonded to each other through the bonding of metal pads 42 to the respective metal pads 142. The bonding may be a hybrid bonding with no extra pressure applied, and may be performed at room temperature (for example, around 21° C.). The top oxide layer of wafer 22 is bonded to the top oxide layer of wafer 102 through oxide-to-oxide bonding when metal pads 42 are bonded to metal pads 142. As a result of the bonding, photo diodes 24, transfer gate transistors 28, floating diffusion capacitors 32, row selectors 126, source followers 128, and reset transistors 130 are coupled to form a plurality of pixel units 300. In some embodiments, pixel units 300 form arrays corresponding to the image sensor array, as shown in FIG. 11. Metal pads 42 and 142 may also be arranged as arrays.

Figure 10:
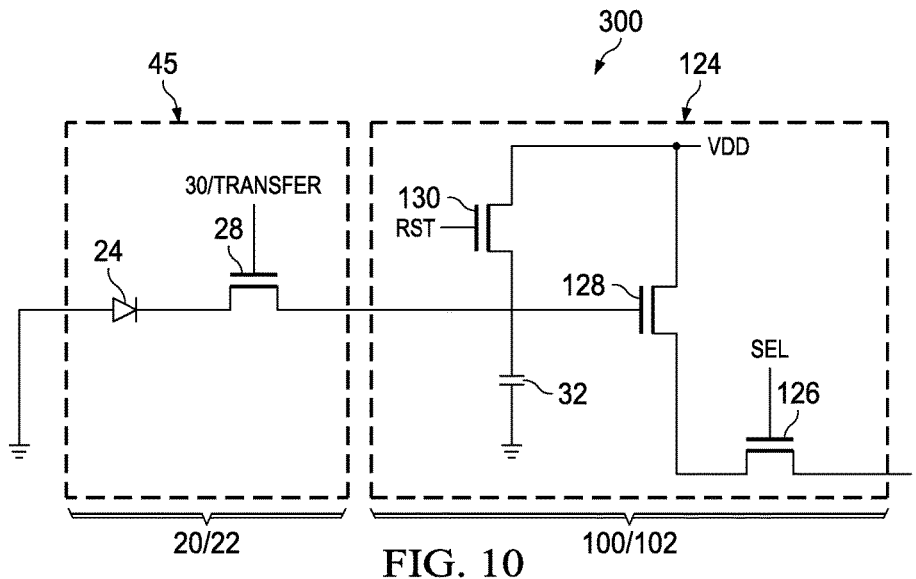
FIG. 10 illustrates a schematic circuit diagram of a pixel unit in accordance with some alternative exemplary embodiments.

FIG. 10 illustrates a circuit diagram of an exemplary pixel unit 300. Pixel unit 300 includes portion 45 in chip 20 and portion 124 in chip 200. In some exemplary embodiments, photo diode 24 has an anode coupled to the electrical ground, and a cathode coupled to a source of transfer gate transistor 28, which has gate 30 coupled to a single line. The single line is also shown in FIG. 4 and marked as "Transfer." The Transfer lines of the pixel units 300 may be connected to ISP circuits 204 in FIG. 7 to receive the control signals. The drain of transfer gate transistor 28 may be coupled to a drain of reset transistor 130 and a gate of the source follower 128. Reset transistor 130 has a gate coupled to a reset line RST, which may be connected to ISP circuits 204 (FIG. 7) to receive further control signals. A source of reset transistor 130 may be coupled to pixel power supply voltage VDD. Floating diffusion capacitor 32 may be coupled between the source/drain of transfer gate transistor 28 and the gate of source follower 128. Reset transistor 130 is used to preset the voltage at floating diffusion capacitor 32 to VDD. A drain of source follower 128 is coupled to a power supply voltage VDD. A source of source follower 128 is coupled to row selector 126. Source follower 128 provides a high-impedance output for pixel unit 300. The row selector 126 functions as the select transistor of the respective pixel unit 300, and the gate of the row selector 126 is coupled to select line SEL, which may be electrically coupled to ISP circuits 204. A drain of the row selector 126 is coupled to an output line, which is coupled to ISP circuits 204 in FIG. 7 to output the signal generated in photo diode 24.

In the operation of pixel unit 300, when light is received by photo diode 24, photo diode 24 generates electrical charges, wherein the amount of the charges is related to the intensity or the brightness of the incident light. The electrical charges are transferred by enabling transfer gate transistor 28 through a transfer signal applied to the gate of the transfer gate transistor 28. The electrical charges may be stored in floating diffusion capacitor 32. The electrical charges enables source follower 128, thereby allowing an electrical charges generated by the photo diodes 24 to pass through source follower 128 to row selector 126. When sampling is desired, the select line SEL is enabled, allowing the electrical charges to flow through row selector 126 to the data process circuits, for example, the ISP circuits 204, which are coupled to the output of the row selector 126.

It should be noted that although FIGS. 4 and 10 illustrate a schematic diagram of an exemplary pixel unit 300 in a BSI image sensor chip, the pixel units 300, which are separated to chips 20 and 100, may also be used in other types of image sensor chips such as front side illumination image sensor chips. It should further be noted that while FIG. 10 illustrates a pixel in a four-transistor structure, a person skilled in art will recognize that the four-transistor diagram is merely an example, which should not unduly limit the scope of the embodiments. One skilled in the art would recognize many variations, alternatives, and modifications. For example, various embodiments may include but not limited to three-transistor pixel, five-transistor pixel and the like.

Figure 5:
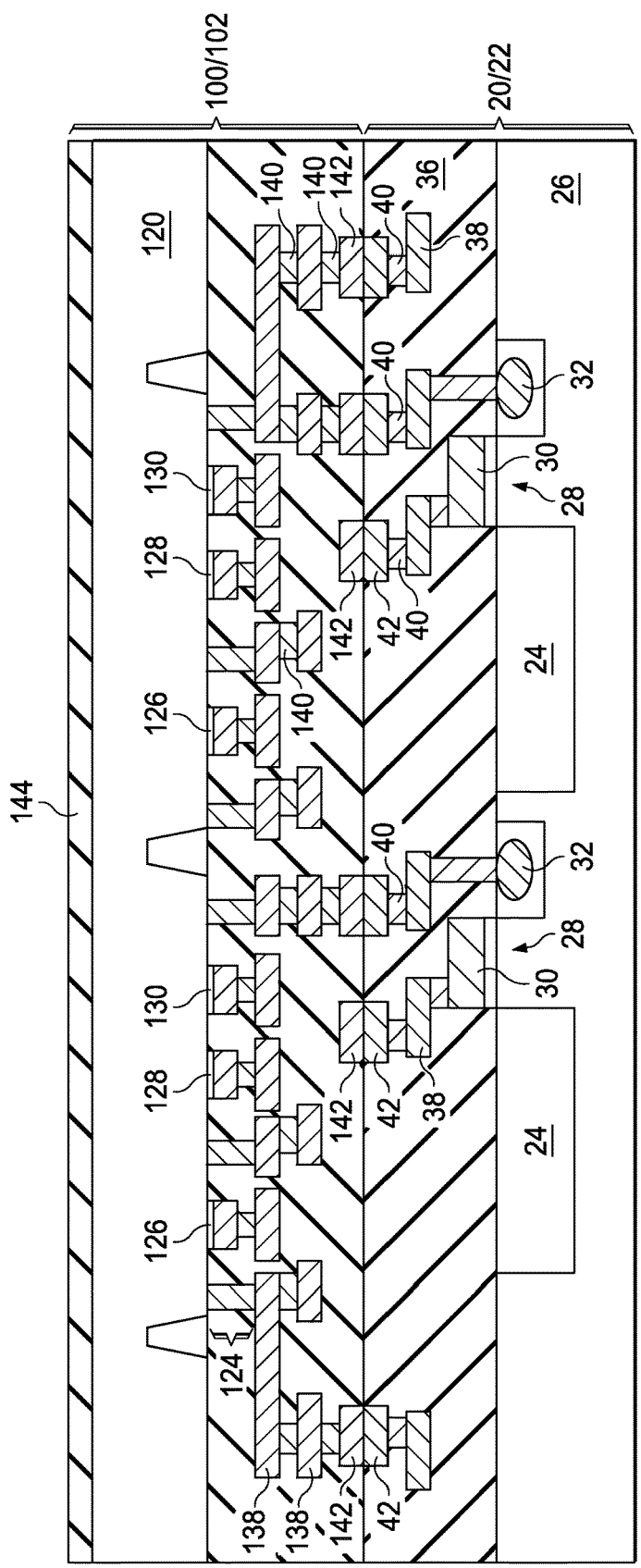
Figure 6:
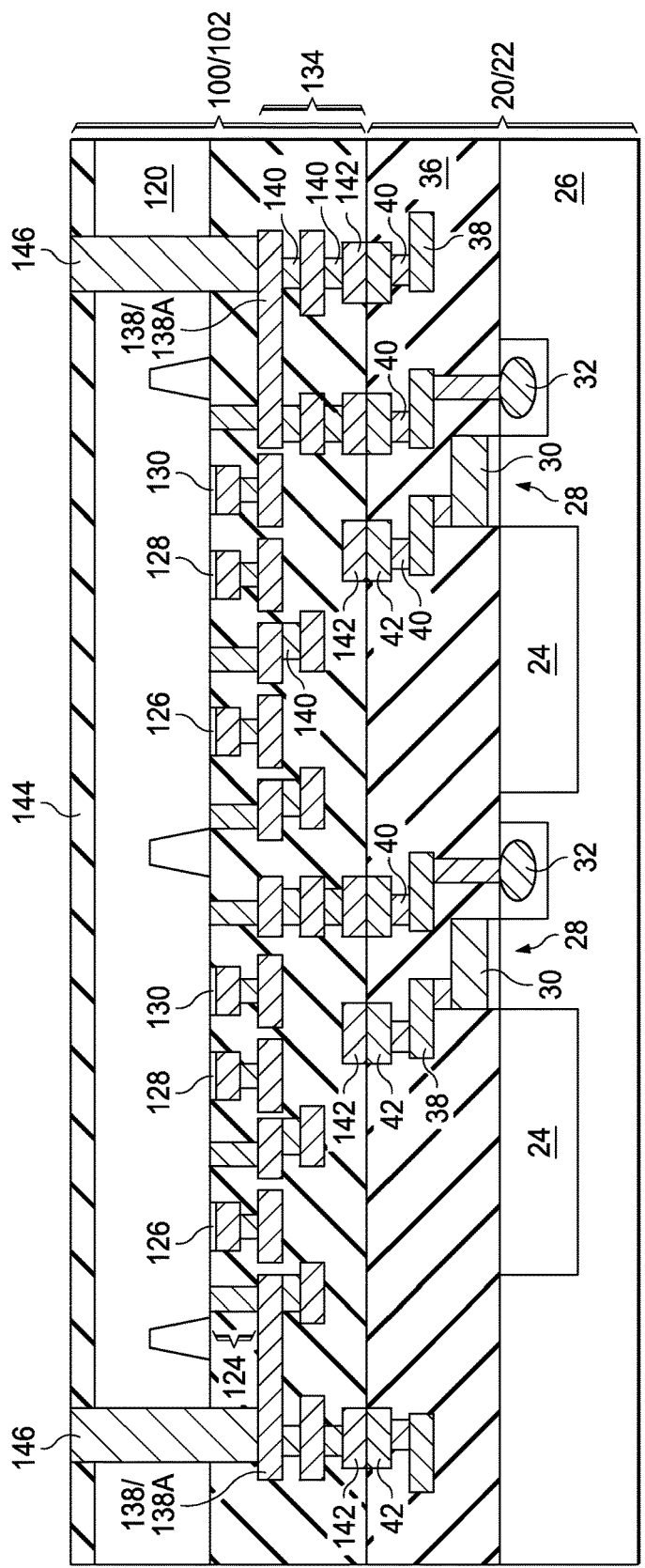

FIG. 5 illustrates the formation of oxide layer 144 on the top surface of substrate 120. For the process of TSVs 146 as shown in FIG. 6, the thinning down of substrate 120 to an optimized thickness may be performed before the formation of oxide layer 144. In some embodiments, the formation of oxide layer 144 is formed through the oxidation of substrate 120. In alternative embodiments, oxide layer 144 is deposited on substrate 120. Oxide layer 144 may comprise silicon oxide, for example.

Next, as shown in FIG. 6, Through Substrate Vias (TSVs) 146, or sometimes referred to as Through Vias (TVs) 146, are formed. The formation process may include etching oxide layer 144, substrate 120, and some dielectric layers in chip 100 to form a TSV opening, until metal pads 138A are exposed. Metal pads 138A may be in the bottom metal layer that is closest to devices 126, 128, and 130, or may be in a metal layer that is further away from devices 126, 128, and 130 than the bottom metal layer. The TSV openings are then filled with a conductive material such as a metal or metal alloy, followed by a Chemical Mechanical Polish (CMP) to remove excess portions of the conductive material. As a result of the CMP, the top surfaces of TSVs 146 may be substantially level with the top surface of oxide layer 144, which enables the hybrid bonding of wafer 102 to wafer 202 as shown in FIG. 7.

Figure 7:
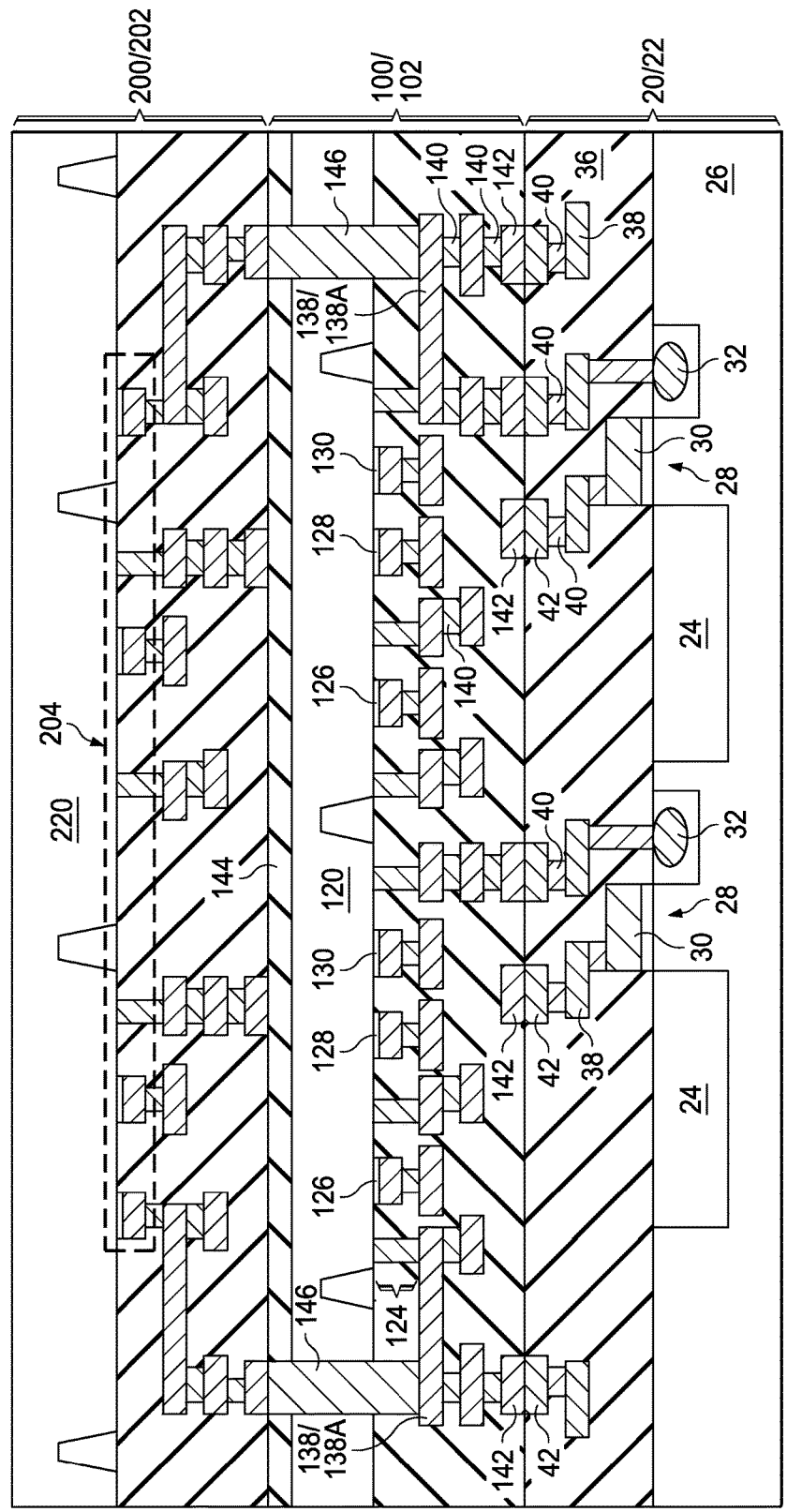

In FIG. 7, wafer 102 is bonded to wafer 202, which includes chips 200 therein. Wafer 202 includes semiconductor substrate 220, and logic circuits 204 formed adjacent to the surface of semiconductor substrate 220. In some embodiments, logic circuits 204 include one or more of ISP circuits that are used for processing the image-related signals obtained from chips 20 and 100. Exemplary ISP circuits include ADCs, CDS circuits, row decoders, and/or the like. Logic circuits 204 may also include the application specific circuits that are customized for certain applications. Through such a design, if the resulting package including stacked chips 20/100/200 is to be redesign for a different application, chip 200 may be redesigned, while the design of chips 20 and 100 does not need to be changed.

Figure 8:
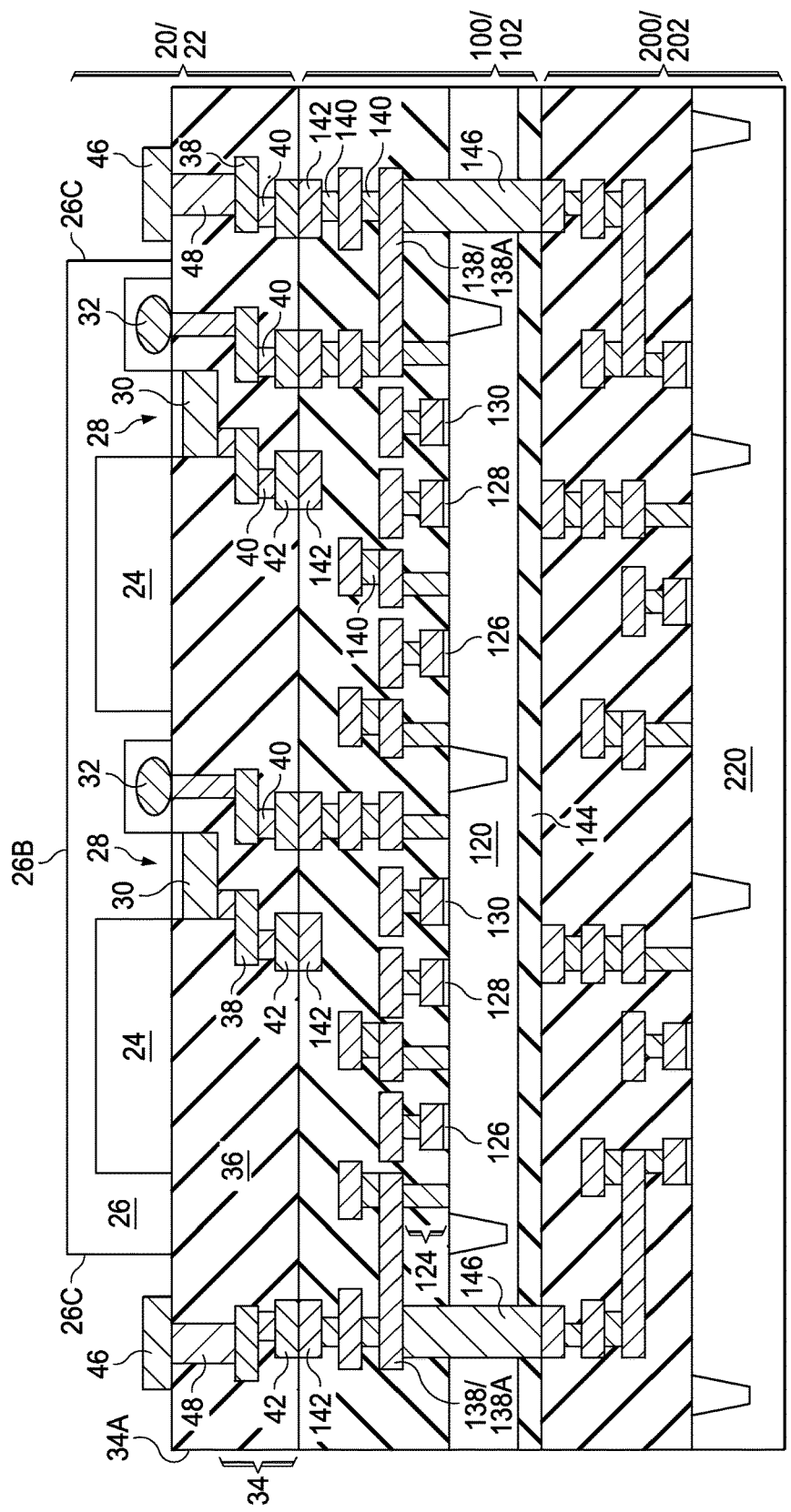

Next, as shown in FIG. 8, a backside grinding is performed to thin down semiconductor substrate 26, and the thickness of substrate 26 is reduced to a desirable value. With semiconductor substrate 26 having a small thickness, light may penetrate from back surface 26B into semiconductor substrate 26, and reach image sensors 24. In the thin down process, wafers 102 and 202 act as a carrier that provides mechanical support to wafer 22, and may prevent wafer 22 from breaking even through wafer 22 has a very small thickness during and after the thinning process. Accordingly, during the backside grinding, no additional carrier is needed.

FIG. 8 further illustrates the etching of substrate 26, and the formation of electrical connectors 46. Electrical connectors 46 may be bond pads, for example, the wire bond pads that are used for forming wire bonding. Through electrical connectors 46, the respective chip 20, 100, and 200 may be electrically coupled to external circuit components (not shown).

As shown in FIG. 8, electrical connectors 46 may be formed at a same level as substrate 26. In some exemplary formation process, substrate 26 is first etched. For example, the edge portions of substrate 26 are etched, and a center portion of substrate 26, in which image sensors 24 are formed, is not etched. As a result, interconnect structure 34 extends beyond the respective edges 26C of substrate 26. For example, the left edge 34A of interconnect structure 34 is further on the left than the left edge 26C of substrate 26, and/or the right edge 34A of interconnect structure 34 is further on the right than the right edge 26C of substrate 26.

In the exemplary formation process, after the removal of the portions of substrate 26, an underlying dielectric layer is exposed. In some embodiments, the exposed dielectric layer is an Inter-Layer Dielectric (ILD), a Contact Etch Stop Layer (CESL), or the like. Next, deep vias 48 are formed in the dielectric layers in chip 20, and electrically couple to interconnect structure 34. The formation process includes etching the dielectric layers to form openings, and filling the resulting openings with a conductive material to form deep vias 48. Electrical connectors 46 are then formed, for example, by a deposition step followed by a patterning step.

Figure 9:
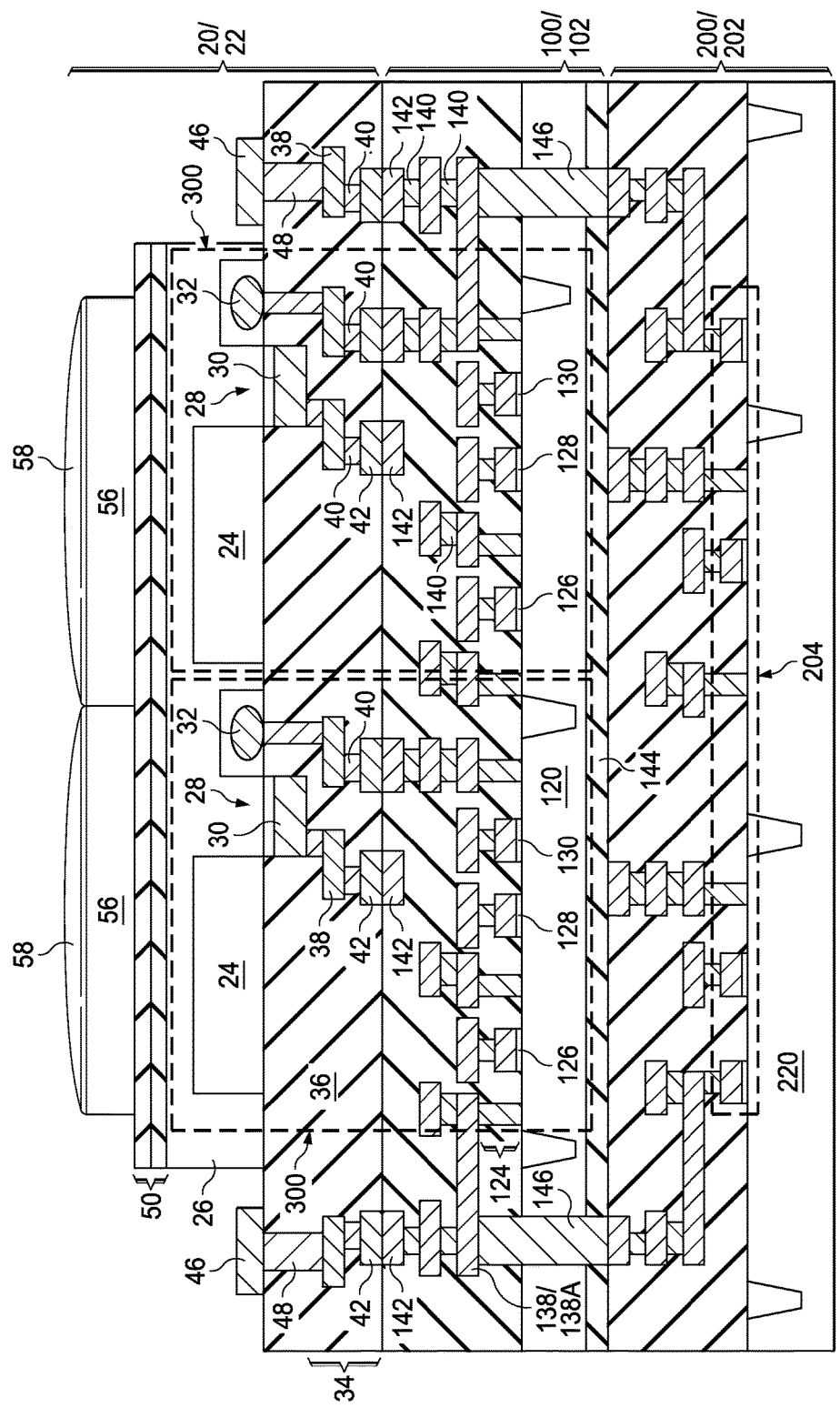

Next, as shown in FIG. 9, upper layers 50 (sometimes referred to as buffer layers) are formed on the back surface of semiconductor substrate 26. In some exemplary embodiments, upper layers 50 include one or more of a Bottom Anti-Reflective Coating (BARC), a silicon oxide layer, and a silicon nitride layer. In subsequent process steps, additional components such as metal grids (not shown), color filters 56, micro-lenses 58, and the like, are further formed on the backside of wafer 22. The resulting stacked wafers 22, 102, and 202 are then sawed apart into dies, wherein each of the dies includes one chip 20, one chip 100, and one chip 200.

In the embodiments, by moving at least some of, or possibly all of, row selectors 126, source followers 128, reset transistors 130 out of chip 20, the fill factor of pixel units 300 is improved, wherein the fill factor may be calculated as the chip area occupied by photo diode 24 divided by the total chip area of the respective pixel unit 300. The improvement in the fill factor results in the increase in the quantum efficiency of the pixels. Furthermore, since row selectors 126, source followers 128, reset transistors 130, and peripheral circuits 204 are logic devices whose formation is decoupled from the formation of photo diodes 24 and transfer gate transistors 28, the adverse effect to the performance of photo diodes 24 caused by the formation of the logic devices is eliminated, and the signal-to-noise ratio, the sensitivity, and the dynamic range of the pixels are improved.

Furthermore, by further moving the logic circuits that are not parts of the pixel units out of chip 100 and into chip 200, the top-view size of the resulting stacked image sensor chips is reduced. In addition, customized circuits that are specific for the applications may be placed in chip 200. Accordingly, for different applications, chip 200 may be re-designed, while chips 20 and 100 do not need to be re-designed. The cycle time in the design and manufacturing is thus improved.

In accordance with embodiments, a device includes an image sensor chip having an image sensor therein. A read-out chip is underlying and bonded to the image sensor chip, wherein the read-out chip includes a logic device selected from the group consisting essentially of a reset transistor, a source follower, a row selector, and combinations thereof therein. The logic device and the image sensor are electrically coupled to each other, and are parts of a same pixel unit. A peripheral circuit chip is underlying and bonded to the read-out chip, wherein the peripheral circuit chip includes a logic circuit.

In accordance with other embodiments, a device includes an image sensor chip, a read-out chip, and a peripheral circuit chip. The image sensor chip includes a sensor array including a plurality of image sensors and a plurality of transfer gate transistors, wherein each of the plurality of transfer gate transistors is electrically coupled to one of the plurality of image sensors. The image sensor chip further includes an electrical connector at a top surface. The read-out chip is underlying and bonded to the image sensor chip. The read-out chip includes a plurality of reset transistors, a plurality of source followers, and a plurality of row selectors electrically coupled to the plurality of image sensors and the plurality of transfer gate transistors to form a pixel unit array comprising a plurality of pixel units. The peripheral circuit chip is underlying and bonded to the read-out chip. The peripheral circuit chip includes a circuit selected from the group consisting essentially of an ADC, a CDS circuit, a row decoder, and combinations thereof.

In accordance with yet other embodiments, a method includes performing a first bonding step to bond an image sensor chip to, and underlying, a read-out chip. The image sensor chip includes a first semiconductor substrate, and an image sensor disposed adjacent to a surface of the first semiconductor substrate. The read-out chip includes a second semiconductor substrate, and a logic device selected from the group consisting essentially of a reset transistor, a source follower, a row selector, and combinations thereof at a surface of the second semiconductor substrate. The logic device and the image sensor are electrically coupled to each other, and form parts of a same pixel unit. The method further includes performing a second bonding step to bond a peripheral circuit chip to, and underlying, the read-out chip. The peripheral circuit chip includes a third semiconductor substrate, and a logic circuit at a surface of the third semiconductor substrate. An electrical connector is formed at a top surface of the image sensor chip.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    an image sensor chip comprising:
        a semiconductor substrate and an image sensor; and
        an interconnect structure underlying the semiconductor substrate, wherein the interconnect structure comprises dielectric layers and metal lines and vias in the dielectric layers, wherein the interconnect structure comprises:
            a first portion overlapped by the semiconductor substrate; and
            a second portion laterally extending beyond the semiconductor substrate; and
    a read-out chip underlying and bonded to the image sensor chip, wherein the read-out chip comprises a logic device selected from the group consisting essentially of a reset transistor, a source follower, a row selector, and combinations thereof therein, and wherein the logic device and the image sensor are electrically coupled to each other, and are parts of a same pixel unit;
    a peripheral circuit chip underlying and bonded to the read-out chip, wherein the peripheral circuit chip comprises a logic circuit; and
    an electrical connector comprising a bottom surface contacting a top surface of a top dielectric layer, wherein the top dielectric layer is in the second portion of the interconnect structure, wherein the semiconductor substrate has a portion level with the electrical connector.

2. The device of claim 1, wherein the image sensor chip further comprises:
    a via electrically coupled to the electrical connector, wherein the via extends into the second portion of the interconnect structure of the image sensor chip.

3. The device of claim 1, wherein the image sensor chip further comprises:
    a transfer gate transistor therein, wherein the transfer gate transistor is electrically coupled to the image sensor, and wherein the transfer gate transistor is a part of the same pixel unit; and
    a bond pad at a bottom surface of the image sensor chip, wherein the bond pad is electrically connected to a gate of the transfer gate transistor, and the bond pad has a bottom surface coplanar with the bottom surface of the image sensor chip.

4. The device of claim 3, wherein the image sensor chip is substantially free from additional transistors other than transfer gate transistors, with the transfer gate transistors being comprised in pixel units.

5. The device of claim 1, wherein the image sensor chip further comprises a floating diffusion capacitor therein, wherein the floating diffusion capacitor is electrically coupled to the image sensor, and wherein the floating diffusion capacitor is a part of the same pixel unit.

6. The device of claim 1, wherein the read-out chip comprises the reset transistor, the source follower, and the row selector.

7. The device of claim 1, wherein the logic circuit in the peripheral circuit chip further comprises an Image Signal Processing (ISP) circuit in the read-out chip, wherein the ISP circuit comprises a circuit selected from the group consisting essentially of an Analog-to-Digital Converter (ADC), a Correlated Double Sampling (CDS) circuit, a row decoder, and combinations thereof.

8. The device of claim 1, wherein the electrical connector has a bottom surface substantially coplanar with a bottom surface of the semiconductor substrate.

9. A device comprising:
   an image sensor chip comprising:
      a semiconductor substrate;
      a sensor array comprising a plurality of image sensors in the semiconductor substrate;
      a plurality of transfer gate transistors, wherein each of the plurality of transfer gate transistors is electrically coupled to one of the plurality of image sensors;
      a first plurality of bond pads, each connected to a gate of one of the plurality of transfer gate transistors; and
      a wire bond pad configured to form wire bonding thereon, wherein the wire bond pad overlaps a portion of the image sensor chip, and the portion of the image sensor chip is level with a bottom portion of the semiconductor substrate;
   a read-out chip underlying and bonded to the image sensor chip, wherein the read-out chip comprises:
      a second plurality of bond pads, each bonded to and in physical contact with one of the first plurality of bond pads;
      a plurality of reset transistors;
      a plurality of source followers; and
      a plurality of row selectors electrically coupled to the plurality of image sensors and the plurality of transfer gate transistors to form a pixel unit array comprising a plurality of pixel units; and
   a peripheral circuit chip underlying and bonded to the read-out chip, wherein the peripheral circuit chip comprises a circuit selected from the group consisting essentially of an Analog-to-Digital Converter (ADC), a Correlated Double Sampling (CDS) circuit, a row decoder, and combinations thereof.

10. The device of claim 9, wherein the image sensor chip and the read-out chip are bonded through a hybrid bonding comprising a metal-to-metal bonding and an oxide-to-oxide bonding.

11. The device of claim 9, wherein the image sensor chip further comprises:
   a plurality of floating diffusion capacitors, and wherein each of the plurality of floating diffusion capacitors is electrically coupled to one of the plurality of image sensors, and forms a part of a respective one of the plurality of pixel units; and
   a third plurality of bond pads, each connected to one of the plurality of floating diffusion capacitors.

12. The device of claim 9, wherein the semiconductor substrate comprises a portion higher than a tops surface of the wire bond pad.

13. A method comprising:
   performing a first bonding step to bond an image sensor chip to, and underlying, a read-out chip, wherein the image sensor chip comprises:
      a first semiconductor substrate; and
      an image sensor disposed adjacent to a surface of the first semiconductor substrate;
   wherein the read-out chip comprises:
      a second semiconductor substrate; and
      a logic device selected from the group consisting essentially of a reset transistor, a source follower, a row selector, and combinations thereof at a surface of the second semiconductor substrate, wherein the logic device and the image sensor are electrically coupled to each other, and form parts of a same pixel unit;
   performing a second bonding step to bond a peripheral circuit chip to, and underlying, the read-out chip, wherein the peripheral circuit chip comprises:
      a third semiconductor substrate; and
      a logic circuit at a surface of the third semiconductor substrate; and
   etching-through a portion of the first semiconductor substrate to expose a dielectric layer in the image sensor chip, wherein the dielectric layer is underlying the first semiconductor substrate; and
   forming a wire bond pad in a space left by the etched portion of the first semiconductor substrate.

14. The method of claim 13, wherein the first and the second bonding steps are performed at wafer level, with the image sensor chip, the read-out chip, and the peripheral circuit chip being in respective un-sawed wafers.

15. The method of claim 13 further comprising, after the second bonding step, forming color filters and micro-lenses at a top surface of the image sensor chip.

16. The method of claim 13, wherein the first semiconductor substrate comprises a center portion, and edge portions on opposite sides of the center portion, with the edge portions extending to edges of the image sensor chip, and during the etching-through, the edge portions are removed.

17. The method of claim 13, wherein substantially no Image Signal Processing (ISP) circuit is in the image sensor chip and the read-out chip.

18. The method of claim 13, wherein the forming the wire bond pad is performed after the first bonding.

19. The method of claim 13 further comprising performing a wire bonding on the wire bond pad.

20. The method of claim 13 further comprising:
   after etching the first semiconductor substrate, etching dielectric layers exposed as a result of the etching the first semiconductor substrate to form an opening, wherein the dielectric layers are portions of the image sensor chip; and
   filling the opening to form a deep via, wherein the wire bond pad is connected to the deep via.

* * * * *